(12) United States Patent
Bedeschi

(10) Patent No.: US 9,336,874 B2
(45) Date of Patent: May 10, 2016

(54) MIXED MODE PROGRAMMING FOR PHASE CHANGE MEMORY

(71) Applicant: MICRON TECHNOLOGY, INC., Boise, ID (US)

(72) Inventor: Ferdinando Bedeschi, Biassono (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/486,883

(22) Filed: Sep. 15, 2014

(65) Prior Publication Data

US 2015/0003149 A1   Jan. 1, 2015

Related U.S. Application Data

(63) Continuation of application No. 13/512,008, filed as application No. PCT/IT2009/000583 on Dec. 29, 2009, now Pat. No. 8,854,861.

(51) Int. Cl.
*G11C 11/00* (2006.01)
*G11C 13/00* (2006.01)

(52) U.S. Cl.
CPC ........ *G11C 13/0064* (2013.01); *G11C 13/0004* (2013.01); *G11C 13/0069* (2013.01); *G11C 2013/009* (2013.01); *G11C 2013/0078* (2013.01); *G11C 2013/0092* (2013.01); *G11C 2213/72* (2013.01)

(58) Field of Classification Search
USPC .......................................... 365/148
See application file for complete search history.

(56) References Cited

U.S. PATENT DOCUMENTS

| | | | |
|---|---|---|---|
| 2006/0166455 A1 | 7/2006 | Gordon et al. | |
| 2007/0236987 A1* | 10/2007 | Cho et al. | 365/163 |
| 2008/0123389 A1 | 5/2008 | Cho et al. | |
| 2009/0034320 A1 | 2/2009 | Ueda | |

OTHER PUBLICATIONS

International Search Report mailed Jun. 8, 2010 in corresponding International Application No. PCT/IT2009/000583.
Written Opinion mailed Jun. 8, 2010 in corresponding International Application No. PCT/IT2009/000583.

* cited by examiner

*Primary Examiner* — Anthan Tran
(74) *Attorney, Agent, or Firm* — Holland & Hart LLP

(57) ABSTRACT

Subject matter disclosed herein relates to a memory device, and more particularly to write performance of a phase change memory.

17 Claims, 6 Drawing Sheets

MIXED MODE PROGRAMMING FOR PHASE CHANGE MEMORY

BACKGROUND

1. Field

Subject matter disclosed herein relates to a memory device, and more particularly to write performance of a phase change memory.

2. Information

Phase change memory (PCM) may operate based, at least in part, on behavior and properties of one or more particular phase change materials, such as chalcogenide alloy and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

In one example, a PCM memory cell may transition from an amorphous state to a crystalline state by applying a bias signal to the memory cell. Characteristics of a bias signal, such as peak magnitude and/or pulse width, for example, may be selected to allow a transition to a crystalline state. An improper selection of bias signal characteristics may result in a failure to transition to a crystalline state. Accordingly, such an improper selection may result in a PCM memory cell comprising a mixture of material in an amorphous and a crystalline state, which may lead to an undefined memory cell state resulting in a failure of the PCM memory cell, for example, or in decreased reliability (e.g., higher drift, lower data retention, and/or reduced endurance). On the other hand, a proper selection of bias signal characteristics may be relatively difficult to determine because biasing conditions for individual memory cells in a PCM may vary.

In another example, a reset pulse may be applied to a PCM memory cell to drive a phase transition from a crystalline state to an amorphous state. In one case, the amplitude of such a reset pulse may fail to result in a desirable size of an amorphous region of a PCM memory cell. Accordingly, such a PCM memory cell may lack an ability to retain data for relatively long periods of time at relatively high temperatures, such as for ten or twenty years at 85 C, for example. In another case, the amplitude of such a reset pulse applied to a PCM memory cell may be relatively large as to damage the PCM memory cell or to induce a memory cell failure during set and/or reset cycles, for example, after a relatively large number of such cycles, such as one million cycles, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
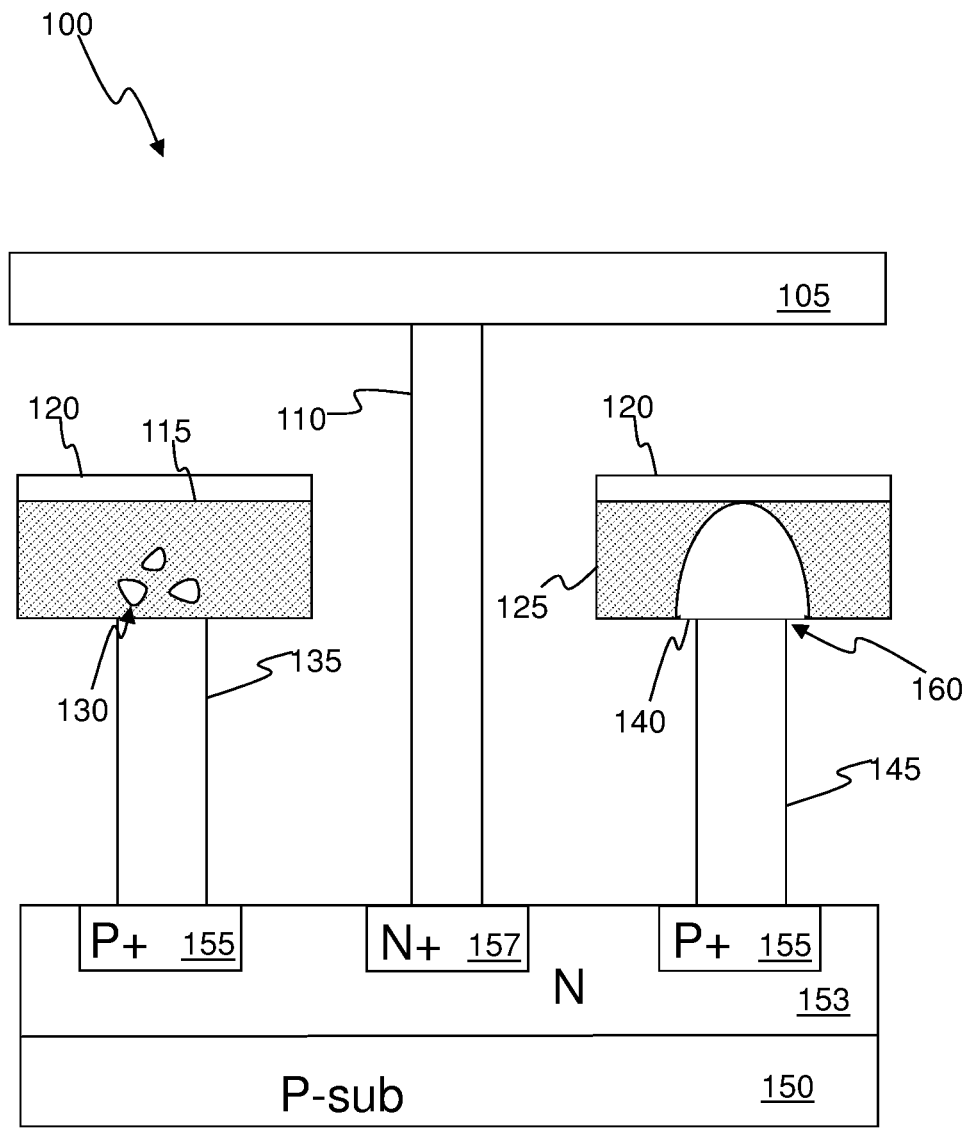
FIG. 1 is a schematic diagram of a portion of phase change memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving a bias signal to lead to a phase transition of an active volume of phase change material in a phase change memory (PCM) cell during a programming phase of a memory operation. Such a bias signal may comprise a set pulse to transition a phase change material to a crystalline phase, or a reset pulse to transition a phase change material to an amorphous phase. Such a programming phase may result from a write command directed to the PCM in order to write and store a bit of information. For example, such a bias signal may be applied to a PCM cell during read and/or write operations by a memory controller, for example. Particular characteristics of a bias signal may lead to a desired program pulse in terms of amorphous volume, crystallization volume, and/or overall speed of a PCM, for example. Here, a desired program pulse may achieve a relatively fast effective crystallization and/or a relatively long lasting amorphous phase of a PCM cell, for example.

In an embodiment, a PCM may comprise a plurality of PCM cells that include phase change material. Due to variations in fabrication conditions from lot to lot and/or from region to region on a semiconductor wafer, for example, characteristics and/or physical parameters of such PCM cells and/or associated circuitry elements may vary. Such associated circuitry elements, which may have their own respective electrical resistance, may comprise cell selecting elements, word lines, bit lines, and/or decoding elements, just to name a few examples. Of course, such variations may result from any of a number of situations or conditions. For another example, physical position of a PCM cell in a circuit may affect and/or modify physical parameters of a PCM cell. Accordingly, one portion of PCM cells in a PCM may behave differently from another portion of PCM cells. In one implementation, a particular bias signal may affect some PCM cells differently from other PCM cells. Accordingly, one portion of PCM cells in a PCM may behave differently from another portion of PCM cells in response to an applied bias signal having a particular magnitude. For example, a particular magnitude of an applied program bias signal applied to one PCM cell may result in phase change material in the PCM cell being in a crystalline phase, while the same program bias signal applied to another PCM cell may result in phase change material in the PCM cell being in an amorphous phase (or a mixture of amorphous and crystalline phases), for example.

To address such PCM cell variability, in a particular implementation, a bias signal to program a PCM cell may comprise a voltage-regulated portion and a current-regulated portion. As explained in further detail below, a voltage-regulated bias signal may be generated using a voltage source, whereas a current-regulated bias signal may be generated using a current source. Each such portion of a bias signal may comprise one or more individual bias pulses applied to a PCM cell until phase change material in the PCM cell transitions to a bias state. In particular, subsequent bias pulses may have a larger peak amplitude than that of a previous bias pulse. In one implementation, a series of such bias pulses may comprise a waveform having individual peak amplitudes that sequentially increase from one pulse to the next. Such an implementation may address an issue of variability of physical and/or electrical characteristics of a plurality of PCM cells in a PCM or in multiple PCM devices, for example, in order to improve efficiency of programming PCM cells. Such a bias signal, of course, may comprise a variety of characteristic shapes and/or configurations, and claimed subject matter is not limited in this respect.

In an embodiment, a process of writing to a PCM may comprise a process to verify that a particular bit was successfully written to a memory cell of the PCM. In one implementation, a magnitude of a set or reset pulse may be sequentially increased until a particular PCM cell is determined to be successfully set or reset. In one implementation, a particular bit may comprise a "zero" or reset bit. Here, a reset pulse may be applied to a memory cell to melt and subsequently quench phase change material in the memory cell so that the phase change material has a relatively high resistance. Accordingly, a verify process may include a technique to verify that phase change material was reset to such a high resistance subsequent to application of a reset pulse. On the other hand, such a particular bit may comprise a "one" or set bit. Here, a set pulse may be applied to a memory cell to melt (though such melting need not occur) and relatively slowly cool phase change material in the memory cell so that the phase change material has a relatively low resistance. Accordingly, a verify process may include a technique to verify that phase change material was set to such a low resistance subsequent to application of a set pulse. Of course, details of such a verify process are merely examples, and claimed subject matter is not so limited.

FIG. 1 is a diagram of a portion of phase change memory 100, according to an embodiment. Such a portion is shown to include two memory cells, each memory cell being in a different memory state for illustrative purposes. An N stripe 153 (e.g., acting as a bipolar transistor base) may be formed into a semiconductor P-type substrate 150 (e.g., a collector), which may include P+ doped regions 155 (e.g., emitters) as well as N+ doped region 157 (e.g., contact to base), though other configurations may be used. Phase change memory 100 may include word lines 105, bit lines 120, and word line contact 110. To represent one memory state, a heater 145 contacting a portion of phase change material 125 may heat to melt a portion 140 of phase change material 125, which may then be cooled relatively quickly to comprise amorphous germanium antimony telluride (GST) or other chalcogenide alloy, for example. Such an amorphous material may be relatively highly resistive, resulting in a high-resistance connection to a bitline contact 120. To represent another memory state, a heater 135 contacting a portion of phase change material 115 may heat to melt a portion of phase change material 115, which may then be cooled relatively slowly to provide a crystalline or polycrystalline, low-resistance material. Such polycrystalline phase change material 115 may thus lead to a low-resistance connection to contact 120. In one implementation, a contact area 160 between heater 145 and phase change material 125 may vary from one memory cell to another, as explained in detail below. Of course, details of such a portion of a PCM are merely examples, and claimed subject matter is not so limited.

Polycrystalline phase change material 115 may develop one or more imperfections 130, which may comprise non-crystallized amorphous regions, resulting from performing a crystallization process too quickly and/or using an excessively large or small peak amplitude bias signal. Such imperfections 130 may detrimentally increase resistance of a connection to bitline contact 120, leading to malfunctioning of the memory cell. For example, such a failed memory cell may fail to read the binary value represented by the low-resistance state. Accordingly, avoiding the formation or reducing the number of such imperfections may involve particular programming techniques that use bias signals as described herein, for example.

Figure 2:
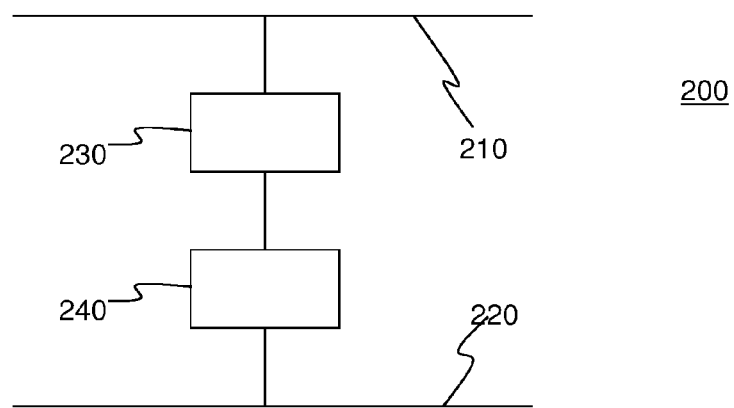
FIG. 2 is a schematic view showing a phase change memory-switch (PCMS) cell, according to an embodiment.

FIG. 2 is a schematic view showing a phase change memory-switch (PCMS) cell 200, according to an embodiment. Such a PCMS cell may be incorporated among a plurality of PCMS cells arranged in an array. In particular, such an array of PCMS cells may be located at intersections of rows and columns of signal lines, thus forming a cross-point array structure. Accordingly, a memory controller, for example, may select a particular PCMS cell for a write, read, and/or erase operation by applying such an operation via a particular pair of row-column lines intersecting at an affected PCMS cell. A PCMS cell is merely one type of PCM memory cell that may benefit from embodiments of bias signals described herein, and claimed subject matter is not limited to any such memory type.

PCMS cell 200 may comprise switch portion 230 and memory portion 240 electrically connected in series. In one implementation, switch portion 230 may be electrically connected and adjacent to column line 210 while memory portion 240 may be electrically connected and adjacent to row line 220. In another implementation, switch portion 230 may be electrically connected and adjacent to row line 220 while memory portion 240 may be electrically connected and adjacent to column line 210. A plurality of such row and column lines may be individually selected by a memory controller (not shown), for example, to select one or more particular memory cells using row and/or column selector elements (not shown). Thus, switch portion 230 may be operated by a memory controller to provide a relatively low impedance path to a connected memory portion, for example.

Figure 3:
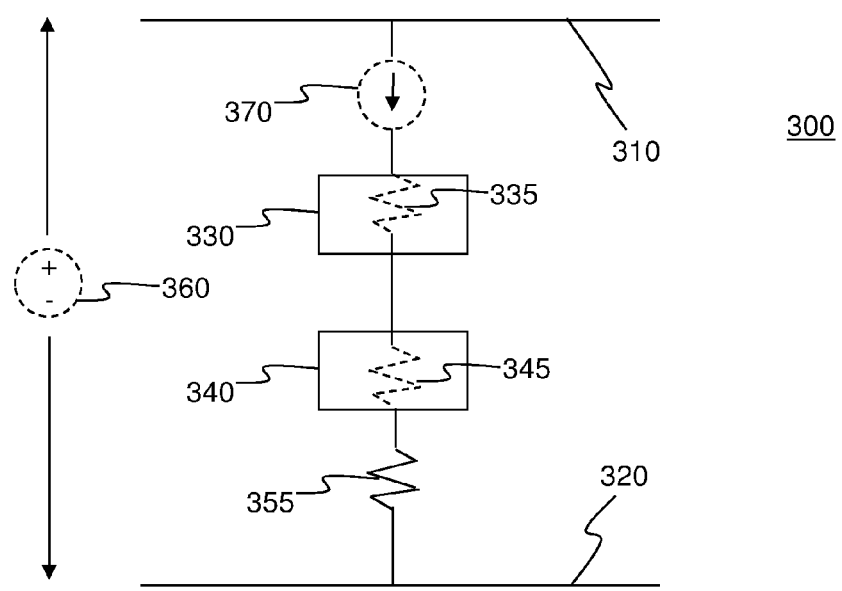
FIG. 3 is a schematic view showing resistive elements associated with a phase change memory cell, according to an embodiment.

FIG. 3 is a schematic view showing resistive elements associated with a PCM cell 300, according to an embodiment. Such a PCM cell may comprise PCMS cell 200, shown in FIG. 2, for example, though claimed subject matter is not limited any such particular type of memory cell. Memory cell 300 may comprise switch portion 330 and memory portion 340 electrically connected in series. In one implementation, switch portion 330 may be electrically connected to column line 310 while memory portion 340 may be electrically connected to row line 320. As described above, a plurality of such row and column lines may be individually selected by a memory controller (not shown), for example, to select one or more particular memory cells using row and/or column selector elements (not shown), for example. In another implementation, a switch element may comprise a vertical bipolar transistor such as that shown in FIG. 1 comprising P-type substrate 150, N stripe 153, and P+ doped regions 155, for example. Accordingly, a selecting element or switch (e.g., a metal oxide transistor, a junction diode, a bipolar transistor, and/or a chalcogenide switch) used to access a memory cell may include its own resistance.

Memory portion 340 may comprise a resistive element 345 to selectively heat phase change material in the memory portion. For example, resistive element 345 may be similar to heater 145 contacting a portion of phase change material 125, as shown in FIG. 1. A resistance value of resistive element 345 may depend, at least in part, on a contact area between resistive element 345 and phase change material of the memory portion. For example, a relatively large contact area may result in a relatively low resistance value of resistive element 345, whereas a relatively small contact area may result in a relatively large resistance value of resistive element 345. As discussed above, variations in fabrication conditions from lot to lot and/or from region to region on a semiconductor wafer, for example, may lead to variations in contact area, and thus electrical resistance, between resistive element 345 and phase change material of memory cells. Such a variation in electrical resistance may in turn lead to variations in electrical current and/or current density, and thus heating, for a particular voltage. For example, a relatively large contact area may result in a relatively large current, whereas a relatively small contact area may result in a relatively small current, for a particular voltage such as a voltage-regulated bias signal, as described below.

In an embodiment, a voltage-regulated bias signal may be applied to PCM cell 300, so that, to some extent, variations in contact area among memory cells may be compensated for by a regulated voltage. Here, regulated voltage refers to a voltage across a resistance that remains substantially constant regardless of the value of the resistance. For example, such a regulated voltage may be provided by an ideal voltage source 360, which may comprise a circuit element where the voltage across the ideal voltage source is independent of the current through the ideal voltage source. Also, internal resistance of an ideal voltage source is zero, so that the ideal voltage source may be able to supply or absorb any amount of current (in theory). Therefore, a current through ideal voltage source 360 may be determined, at least in part, by resistive element 345 to which the ideal voltage source is connected. Accordingly, as resistance of resistive element 345 varies due to varying contact areas among memory cells, so does the current, but current density through the memory cells remains substantially constant. Thus, in this fashion, variations in contact area among memory cells may be compensated for by a regulated voltage. Although a voltage-regulated bias signal may be provided by such an ideal voltage source, embodiments described herein may involve a voltage-regulated bias signal having less-restrictive characteristics. For example, a voltage level of such a voltage-regulated bias signal need not be independent of a resistance to which it is applied, though the voltage level may be substantially constant regardless of the value of the resistance, as mentioned above.

Returning to FIG. 3, portions of PCM cell 300 may comprise parasitic resistances. For example, switch portion 330 may include a resistance 335. Other parasitic resistances may arise from resistivities of materials that form column lines 310 and row lines 320, and other elements associated with PCM cell 300, for example. In addition, transistors, diodes, and/or other circuit elements that may be present in cell selectors, row and column decoders, and/or power-generating circuit elements, and so on may lead to parasitic effects resulting in added resistance to PCM cell 300, which is represented by parasitic resistance element 355. Such parasitic resistance may lead to a voltage drop across such resistance, thus reducing efficiency of voltage-regulated programming. A current-regulated bias signal, however, may overcome such a problem by maintaining a substantially constant current through PCM cell 300 regardless of added parasitic resistance. Here, regulated current refers to a current through a resistance that remains substantially constant regardless of the value of the resistance. For example, such a regulated current may be provided by an ideal current source 370, which may comprise a circuit element where the current through the ideal current source is independent of the voltage across the ideal current source. Accordingly, such an ideal current source 370 may provide a particular current regardless of the value of resistance through which such a current flows, for example. Although a current-regulated bias signal may be provided by such an ideal current source, embodiments described herein may involve a current-regulated bias signal having less-restrictive characteristics. Although a current may remain substantially unchanged even with the introduction of parasitic resistances, such a substantially constant current may also lead to current density that varies with varying contact areas among memory cells, as described above. Thus, unlike the case for a regulated voltage, variations in contact area among memory cells may not be compensated for by a regulated current.

Thus, in summary, a voltage-regulated bias signal may provide a solution to problems that arise from varying contact areas among memory cells, whereas a current-regulated bias signal may provide a solution to problems that arise from parasitic resistances among memory cells. Accordingly, as described in detail below, a technique for writing to a memory cell may involve an algorithm that applies a voltage-regulated bias signal to a memory cell during initial programming steps, and then, if necessary, subsequently shifts to applying a current-regulated bias signal to the memory cell. Such an algorithm may improve programming efficiency by taking into account the different effects and trade-offs that relatively low currents versus relatively high currents have on a memory cell. For example, such initial steps may use relatively low currents that may involve relatively small effects associated with parasitic resistances while minimizing effects of varying contact area. Latter steps, however, may use relatively high currents, wherein the effects of parasitic resistances become more significant while contact area variation may become less significant. Of course, such details regarding voltage or current regulated bias signals are merely examples, and claimed subject matter is not so limited.

Figure 4:
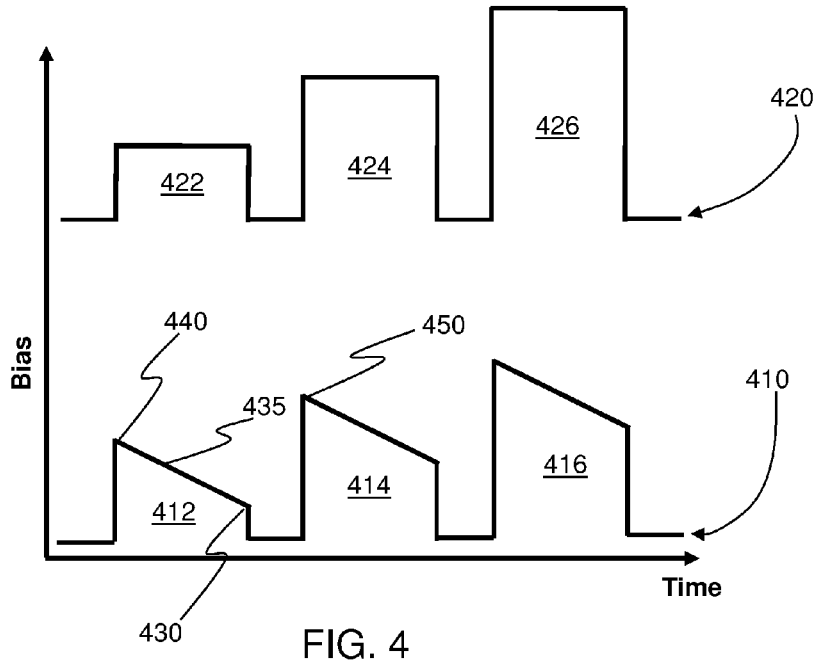
FIG. 4 is a plot of characteristics of bias signal set and reset pulses, according to an embodiment.

FIG. 4 shows a plot 410 of characteristics of bias signal set pulses, according to an embodiment. A series of set pulses 412, 414, and 416 comprises a waveform having individual peak amplitudes that sequentially increase from one pulse to the next, for example. Such an implementation may address an issue of variability of physical and/or electrical characteristics of a plurality of PCM cells in a PCM or in multiple PCM devices, as discussed above. In one particular implementation, first bias pulse 412 may comprise a negative-slope set ramp 435 extending from peak amplitude 440 to a ramp terminus 430. Though set pulse 412 is shown to have a linear set ramp and vertical transitions, plot 400 is only intended to represent a schematic view of bias signal, and claimed subject matter is not limited in this respect. In one particular implementation, peak amplitude 450 of second set pulse 414 may be greater than peak amplitude 440 of the previous, first set pulse 412. In one implementation, initial set pulses may comprise voltage-regulated bias signals and subsequent set pulses may comprise current-regulated bias signals. Thus, to illustrate by example, set pulses 412 and 414 may individually comprise a voltage-regulated bias signal, whereas set pulse 416 may comprise a current-regulated bias signal.

After a set pulse, a process to verify whether a memory cell was successfully set by the set pulse may be implemented. In an embodiment, a verify reference current value may be used as a threshold to which a cell current during verify of a PCM cell is compared. Such a cell current during verify may result by applying a voltage across a PCM cell so that the cell current during verify may depend, at least in part, on a resistance of the PCM cell. Accordingly, the state of a PCM cell, e.g., low resistance or high resistance, may be determined by comparing such a cell current during verify to a verify reference current value. Upon failure of setting a PCM cell, a process of applying set pulse to the PCM cell may be repeated, although with a set pulse having a higher peak current, such as set pulse 414 compared to set pulse 412, for example. In one implementation, a process of reapplying a set pulse to the PCM cell may involve transitioning from applying voltage-regulated set pulses to current-regulated set pulses, as discussed above. Of course, such details of verify reference current values and techniques using same are merely examples, and claimed subject matter is not limited in this respect.

Also shown in FIG. 4 is a plot 420 of characteristics of bias signal reset pulses, according to an embodiment. A series of reset pulses 422, 424, and 426 comprises a waveform having individual amplitudes that sequentially increase from one pulse to the next, for example. As for the case of set pulses described above, such an implementation of reset pulses may address an issue of variability of physical and/or electrical characteristics of a plurality of PCM cells in a PCM or in multiple PCM devices. Though reset pulses 422, 424, and 426 are shown to have vertical transitions and flat peak amplitudes, plot 420 is only intended to represent a schematic view of a bias signal, and claimed subject matter is not limited in this respect. In one implementation, initial reset pulses may comprise voltage-regulated bias signals and subsequent reset pulses may comprise current-regulated bias signals. Thus, to illustrate by example, reset pulses 422 and 424 may individually comprise a voltage-regulated bias signal, whereas reset pulse 426 may comprise a current-regulated bias signal.

After a reset pulse, a process to verify whether a memory cell was successfully reset by the reset pulse may be implemented. In an embodiment, a verify reference current value may be used as a threshold to which a cell current during verify of a PCM cell is compared. Such a cell current during verify may result by applying a voltage across a PCM cell so that the cell current during verify may depend, at least in part, on a resistance of the PCM cell. Accordingly, the state of a PCM cell, e.g., low resistance or high resistance, may be determined by comparing such a cell current during verify to a verify reference current value. Upon failure of resetting a PCM cell, a process of applying reset pulse to the PCM cell may be repeated, although with a reset pulse having a higher peak current, such as reset pulse 424 compared to reset pulse 422, for example. In one implementation, a process of reapplying a reset pulse to the PCM cell may involve transitioning from applying voltage-regulated reset pulses to current-regulated reset pulses, as discussed above. Of course, such details of verify reference current values and techniques using same are merely examples, and claimed subject matter is not limited in this respect.

Figure 5:
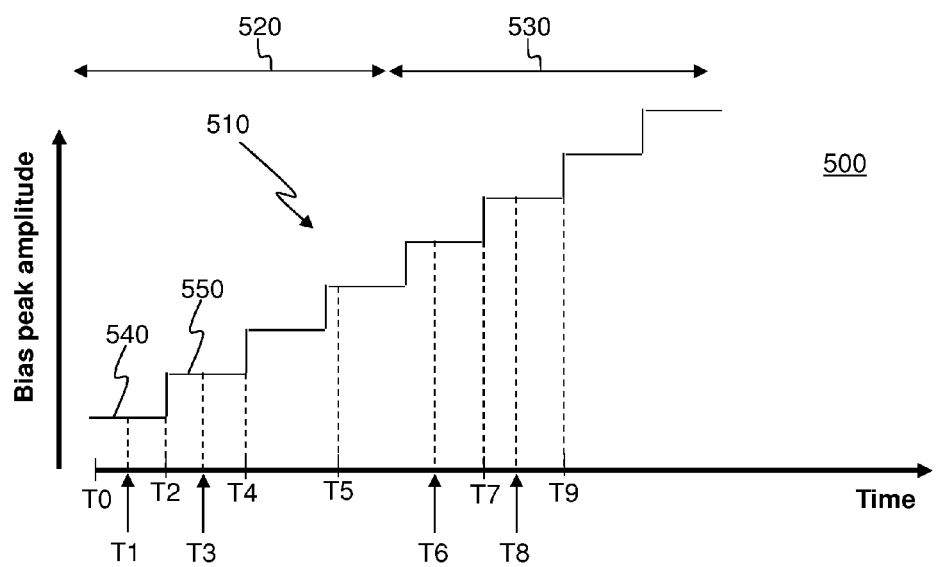
FIG. 5 is a plot of characteristics of a bias signal waveform, according to another embodiment.

FIG. 5 is a plot 500 of characteristics of a bias signal waveform 510, according to another embodiment. As mentioned above, a bias signal may comprise one or more individual bias pulses applied to a PCM cell until phase change material in the PCM cell transitions to a crystalline state. In particular, subsequent bias pulses may have a larger peak amplitude than a previous bias pulse. A series of bias pulses represented by range 520 in FIG. 5 may comprise voltage-regulated bias pulses, whereas the series of bias pulses represented by range 530 may comprise current-regulated bias pulses, just to illustrate an example. Bias signal waveform 510 comprises a plot of peak amplitudes of a series of bias pulses. For example, portion 540 of waveform 510 may represent peak amplitude 440 of bias pulse 412 shown in FIG. 4, whereas portion 550 of waveform 510 may represent peak amplitude 450 of bias pulse 414. Thus, negative-slope set ramp portions of a set pulse, such as ramp 435, are not shown in plot 500 for the sake of clarity.

Illustrating an example where a bias signal is applied to a PCM cell in order to program the PCM cell, a voltage-regulated bias pulse with peak amplitude 540 may be applied at time T0. Subsequently, at time T1, after applying a negative-slope set ramp in the case of a set bias pulse (not shown), for example, a verify process may be implemented to verify whether or not the PCM cell was programmed successfully. If so, then the programming process may end. Otherwise, a subsequent voltage-regulated bias pulse with relatively higher peak amplitude 550 may be applied at time T2. Again, at time T3, after applying a negative-slope set ramp in the case of a set bias pulse (not shown), for example, a verify process may be implemented to verify whether or not the PCM cell was programmed successfully. If so, then the programming process may end. Otherwise, a subsequent voltage-regulated bias pulse with a relatively higher peak amplitude may be applied at time T4. Such a sequence of program-verify processes may continue until the PCM cell is successfully programmed or, as at time T5 in the present example, voltage-regulated bias pulses are no longer applied while current-regulated bias pulses are subsequently applied to the PCM cell. Thus, at time T6, after applying a negative-slope set ramp, in the case of a set bias pulse (not shown), for example, a verify process may be implemented to verify whether or not the PCM cell was programmed successfully. If so, then the programming process may end. Otherwise, a subsequent current-regulated bias pulse with a relatively higher peak amplitude may be applied at time T7. Again, at time T8, after applying a negative-slope set ramp, in the case of a set bias pulse (not shown), for example, a verify process may be implemented to verify whether or not the PCM cell was programmed successfully. If so, then the programming process may end. Otherwise, a subsequent current-regulated bias pulse with a relatively higher peak amplitude may be applied at time T9. Such a sequence of program-verify processes may continue until the PCM cell is successfully programmed or fails to be programmed, which may be the case for a defective PCM cell, for example. Of course, details of such a bias signal waveform are merely examples, and claimed subject matter is not so limited.

Figure 6:
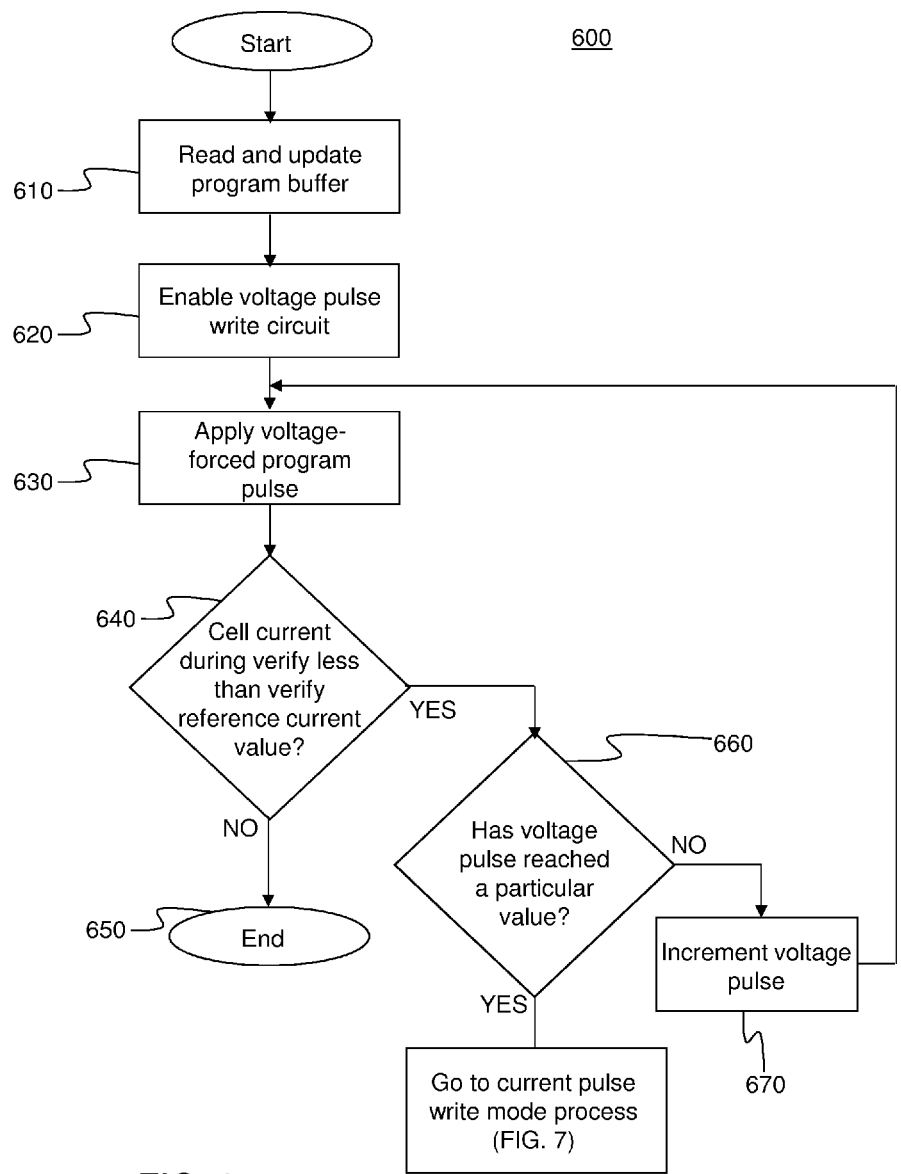
FIG. 6 is a flow diagram of a process of applying a set portion of a voltage-regulated bias signal to a memory cell, according to an embodiment.

FIG. 6 is a flow diagram of a process 600 of applying a bias portion of a voltage-regulated bias signal to a memory cell in response to a write command, for example, according to an embodiment. Such a bias signal may be similar to bias signal 510 shown in FIG. 5, for example. Process 600 may involve a PCM comprising a plurality of PCM cells that include phase change memory. As discussed above, such a plurality of PCM cells may comprise populations of PCM cells that may respond differently to a given bias signal. Such variation in response may result from variations in fabrication conditions of the PCM cells, for example. Accordingly, one portion of PCM cells in a PCM may behave differently from another portion of PCM cells in the PCM. Process 600 may comprise a technique for programming a particular memory cell, wherein physical and/or electrical characteristics of such a particular memory cell may not be accurately known due to variations among such memory cells in a PCM. Such variability may be addressed by process 500 as follows.

At block 610, a program buffer, which may contain user data to be stored into a memory array, may be read and updated in preparation of programming the memory array. For example, process 600 may include determining which memory cells need not be re-programmed if such memory cells are already programmed with appropriate logic values. In another example, process 600 may include determining a new parity to be associated with new user data in case an error correction process is implemented. At block 620, a voltage pulse write circuit may be enabled in preparation of applying voltage-regulated bias pulses to PCM cells in the memory array. In one implementation, a memory device that includes the memory array may include such voltage pulse write circuitry to produce voltage-regulated bias pulses. At block 630, a voltage-regulated program or bias pulse may be applied to a PCM cell. An initial magnitude of such a bias pulse may be established for a particular PCM cell or a plurality of PCM cells, for example. Such an initial magnitude may be selected by considering experimental results, trial and error, and so on of a particular sample of PCM cells and/or PCM devices, though claimed subject matter is not limited in this respect. Such an initial magnitude may comprise a voltage that results in a current of about 200 micro-amps in one cell while another cell (which may have a different contact area, for example) may have a slightly different current, for example, though claimed subject matter is not so limited. At diamond 640, a verify process may be implemented. For example, if the bias pulse successfully sets or resets a PCM cell, then phase change material in the PCM cell may be substantially fully crystallized, resulting in a relatively low resistance. In an array of PCM cells having varying characteristics, for example, some PCM cells may be successfully set or reset with such a set or reset pulse, while other PCM cells may not be successfully set or reset. Thus, success may be determined by measuring such resistance of the memory cell. A voltage may be applied across the memory cell to generate a cell current during verify, which may be measured at diamond 640, for example. As explained above, a cell current during verify may be compared with a verify reference current value to determine whether a memory cell exists in a set state (crystalline) or a reset state (amorphous). Such a verify reference current value may be selected by considering experimental results, trial and error, and so on of a particular sample of PCM cells and/or PCM devices. Such a verify reference current value may be about 20 micro-amps, for example, though claimed subject matter is not so limited. Accordingly, at diamond 640, a determination may be made as to whether or not a cell current during verify is less than a verify reference current value. If a cell current during verify is more than a verify reference current value, then such a result may indicate that a memory cell is successfully set, since resistance of the memory cell is sufficiently low to be in such a set state. Process 600 may then proceed to oval 650, where such a program process may end. However, if a cell current during verify is less than a verify reference current value, then such a result may indicate that a memory cell is not set, since resistance of the memory cell is relatively high. In such a case, process 600 may proceed to block 660 in preparation of a subsequent set pulse.

At diamond 660, a determination is made as to whether or not the last applied set pulse has reached a particular value. Such a value may represent an approximate threshold, beyond which increasing a magnitude of a subsequent voltage-regulated set pulse may become increasingly ineffective. Beyond such a threshold, it may be desirable to begin to apply current-regulated set pulses, as discussed below. Such a threshold may be established for a particular PCM cell or a plurality of PCM cells, for example. For example, such a threshold may be selected by considering experimental results, trial and error, and so on of a particular sample of PCM cells and/or PCM devices, though claimed subject matter is not limited in this respect. If such a value has not been reached or exceeded, a voltage-regulated program or set pulse that is larger than the previously applied set pulse may be applied to a PCM cell. Accordingly, at block 670, a voltage pulse write circuit may be enabled in preparation of applying such an increased voltage-regulated set pulse to the PCM cell. The amount of such an increase may be selected by considering experimental results, trial and error, and so on of a particular sample of PCM cells and/or PCM devices. Such an increase, or step size, may comprise a voltage increase resulting in a current increase of about 50 to 100 micro-amps, for example, though claimed subject matter is not so limited. Process 600 may then return to block 630 to apply the increased voltage-regulated set pulse. Returning to diamond 660, on the other hand, if such a particular value has been reached or exceeded, then process 600 may proceed to a process 700 of applying current-regulated set pulses, shown in FIG. 7.

Figure 7:
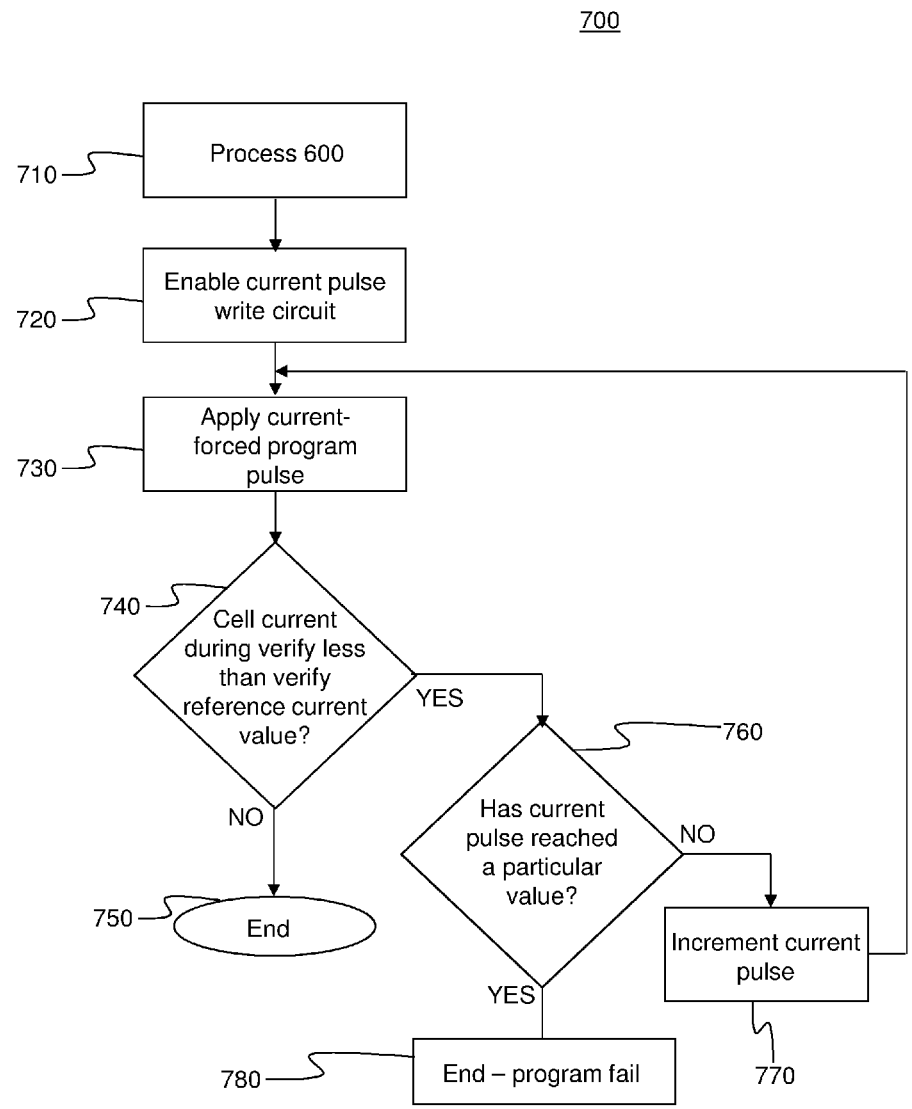
FIG. 7 is a flow diagram of a process of applying a set portion of a current-regulated bias signal to a memory cell, according to an embodiment.

FIG. 7 is a flow diagram of a process 700 of applying a set portion of a current-regulated bias signal to a memory cell, subsequent to applying voltage-regulated set pulses during process 600, shown as block 710. At block 720, a current pulse write circuit may be enabled in preparation of applying current-regulated set pulses to PCM cells in the memory array. In one implementation, a memory device that includes the memory array may include such current pulse write circuitry to produce current-regulated set pulses. At block 730, a current-regulated program or set pulse may be applied to a PCM cell. An initial magnitude of such a current-regulated set pulse may be selected to correspond to a magnitude of the last applied voltage-regulated set pulse, though claimed subject matter is not so limited. For example, the initial magnitude of a current-regulated set pulse may be higher than that of the last voltage-regulated set pulse applied during process 600, though claimed subject matter is not limited in this respect. At diamond 740, a verify process may be implemented. For example, if the set pulse was successful, then phase change material in the memory cell may be substantially fully crystallized, resulting in a relatively low resistance. In an array of PCM cells having varying characteristics, for example, some PCM cells may be successfully set with such a set pulse, while other PCM cells may be not successfully set. Thus, success may be determined by measuring such resistance of the memory cell. A voltage may be applied across the memory cell to generate a cell current during verify, which may be measured at diamond 740, for example. Accordingly, a determination may be made as to whether or not a cell current during verify is less than a verify reference current value. If a cell current during verify is more than a verify reference current value, then such a result may indicate that a memory cell is successfully set, since resistance of the memory cell is sufficiently low to be in such a set state. Process 700 may then proceed to oval 750, where such a program process may end. However, if a cell current during verify is less than a verify reference current value, then such a result may indicate that a memory cell is not set, since resistance of the memory cell is relatively high. In such a case, process 700 may proceed to block 760 in preparation of a subsequent set pulse.

At diamond 760, a determination is made as to whether or not the last applied set pulse has reached a particular value. Such a value may be established for a particular PCM cell or a plurality of PCM cells, for example. For example, such a value may be selected by considering experimental results, trial and error, and so on of a particular sample of PCM cells and/or PCM devices, though claimed subject matter is not limited in this respect. If such a value has not been reached or exceeded, a current-regulated program or set pulse that is larger than the previously applied set pulse may be applied to a PCM cell. Accordingly, at block 770, a current pulse write circuit may be enabled in preparation of applying such an increased current-regulated set pulse to the PCM cell. The amount of such an increase may be selected by considering experimental results, trial and error, and so on of a particular sample of PCM cells and/or PCM devices. Such an increase, or step size, may be about 50 to 100 micro-amps, for example, though claimed subject matter is not so limited. Process 700 may then return to block 730 to apply the increased current-regulated set pulse. On the other hand, if such a particular value in diamond 760 has been reached or exceeded, then process 700 may result in a program fail, which may indicate that the particular PCM cell is defective. Of course, such details of processes 600 and 700 are merely examples, and claimed subject matter is not so limited. For example, claimed subject matter is not limited to verify techniques described above.

Figure 8:
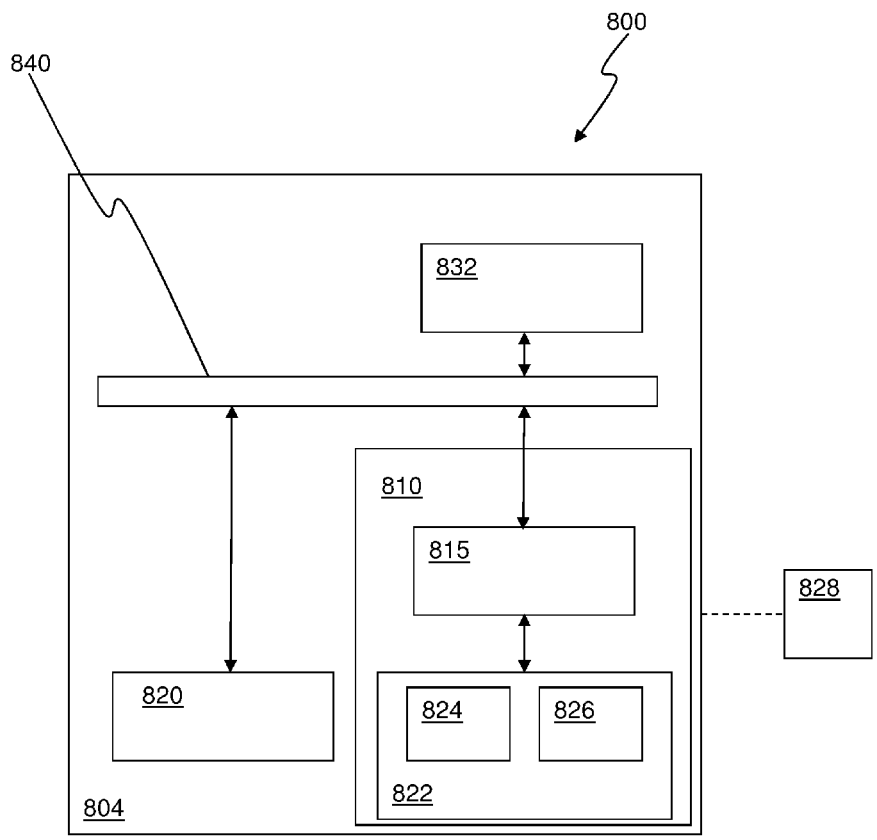
FIG. 8 is a schematic diagram illustrating an exemplary embodiment of a computing system.

FIG. 8 is a schematic diagram illustrating an exemplary embodiment of a computing system 800 including a memory device 810. Such a computing device may comprise one or more processors, for example, to execute an application and/or other code. For example, memory device 810 may comprise a memory that includes PCM 100, shown in FIG. 1. A computing device 804 may be representative of any device, appliance, or machine that may be configurable to manage memory device 810. Memory device 810 may include a memory controller 815 and a memory 822. By way of example but not limitation, computing device 804 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 800, and the processes and methods as further described herein, may be implemented using or otherwise including hardware, firmware, software, or any combination thereof. Thus, by way of example but not limitation, computing device 804 may include at least one processing unit 820 that is operatively coupled to memory 822 through a bus 840 and a host or memory controller 815. Processing unit 820 is representative of one or more circuits configurable to perform at least a portion of a data computing procedure or process. By way of example but not limitation, processing unit 820 may include one or more processors, controllers, microprocessors, microcontrollers, application specific integrated circuits, digital signal processors, programmable logic devices, field programmable gate arrays, and the like, or any combination thereof. Processing unit 820 may include an operating system configured to communicate with memory controller 815. Such an operating system may, for example, generate commands to be sent to memory controller 815 over bus 840. In one implementation, memory controller 815 may comprise an internal memory controller or an internal write state machine, wherein an external memory controller (not shown) may be external to memory device 810 and may act as an interface between the system processor and the memory itself, for example. Such commands may comprise read and/or write commands. In response to a write command, for example, memory controller 815 may provide a bias signal, such as bias signal 510 comprising a series of program pulses having individual peak amplitudes that sequentially increase from one pulse to the next, starting with voltage-regulated program pulses, and continuing with current-regulated program pulses, as shown in FIG. 5, for example. In particular, memory controller 815 may apply a voltage-regulated bias pulse to a PCM cell to place the PCM cell in a low-resistance state in response to a write command. Memory controller 815 may then apply a current-regulated bias pulse to the PCM cell to place the PCM cell in the low-resistance state in response to a first comparison of a measurement of the cell current during verify with a verify reference current value.

Memory 822 is representative of any data storage mechanism. Memory 822 may include, for example, a primary memory 824 and/or a secondary memory 826. Memory 822 may comprise PCM, for example. Primary memory 824 may include, for example, a random access memory, read only memory, etc. While illustrated in this example as being separate from processing unit 820, it should be understood that all or part of primary memory 824 may be provided within or otherwise co-located/coupled with processing unit 820.

Secondary memory 826 may include, for example, the same or similar type of memory as primary memory and/or one or more data storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 828. Computer-readable medium 828 may include, for example, any medium that can carry and/or make accessible data, code, and/or instructions for one or more of the devices in system 800.

Computing device 804 may include, for example, an input/output 832. Input/output 832 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 832 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method, comprising:

applying a voltage-regulated bias pulse to a phase change memory (PCM) cell for programming the PCM cell to a resistive state; and applying a current-regulated bias pulse to the PCM cell for programming the PCM cell to the resistive state,
wherein the PCM cell transitions to the resistive state after applying both the voltage-regulated bias pulse and the current-regulated bias pulse to the PCM cell,
wherein the voltage-regulated bias pulse is one of a plurality of voltage-regulated bias pulses, further comprising applying the plurality of voltage-regulated bias pulses before applying the current-regulated bias pulse.

2. The method of claim 1, wherein applying the plurality of voltage-regulated bias pulses comprises increasing an amplitude of the voltage-regulated bias pulses during applying the plurality of voltage-regulated bias pulses.

3. The method of claim 2, further comprising applying the current-regulated bias pulse to the PCM cell in response to the voltage-regulated bias pulse reaching or exceeding a particular value.

4. The method of claim 1, wherein the current-regulated bias pulse is one of a plurality of current-regulated bias pulses, further comprising applying the plurality of current-regulated bias pulses to transition the PCM cell to the resistive state.

5. The method of claim 4, wherein applying the plurality of current-regulated bias pulses comprises increasing an amplitude of the current-regulated bias pulses during applying the plurality of current-regulated bias pulses.

6. The method of claim 1, wherein the voltage-regulated bias pulse has a negative slope after reaching a peak amplitude.

7. The method of claim 1, wherein the current bias pulse has a negative slope after reaching a peak amplitude.

8. The method of claim 1, wherein applying the current-regulated bias pulse is performed after applying the voltage-regulated bias pulse.

9. The method of claim 1, wherein the PCM cell comprises a phase change material, wherein the phase change material is in a crystalline state with the PCM cell in the resistive state.

10. The method of claim 1, wherein the PCM cell comprises a chalcogenide alloy.

11. The method of claim 1, wherein applying the voltage-regulated bias pulse and the current-regulated bias pulse to the PCM cell comprises providing power to a resistive heating element configured to heat phase change material in the PCM cell.

12. A non-volatile memory device, comprising:
a controller configured to:
apply a voltage-regulated bias pulse to a phase change memory (PCM) cell for programming the PCM cell to a resistive state; and
apply a current-regulated bias pulse to the PCM cell for programming the PCM cell to the resistive state,
wherein the controller is configured to:
apply a plurality of voltage-regulated bias pulses before applying the current-regulated bias pulse; and
change an amplitude of the voltage-regulated bias pulses while the plurality of voltage-regulated bias pulses is applied.

13. The non-volatile memory device of claim 12, wherein the controller is configured to increase the amplitude of the voltage-regulated bias pulses while the plurality of voltage-regulated bias pulses is applied.

14. The non-volatile memory device of claim 12, wherein the controller is configured to apply the current-regulated bias pulse to the PCM cell in response to the voltage-regulated bias pulse reaching or exceeding a particular value.

15. A system, comprising:
a memory device comprising an array of phase change memory (PCM) cells, the memory device further comprising a memory controller configured to:
apply a voltage-regulated bias pulse to a phase change memory (PCM) cell for programming the PCM cell to a resistive state; and
apply a current-regulated bias pulse to the PCM cell for programming the PCM cell to the resistive state; and
a processor to host one or more applications and to initiate the write command to the memory controller,
wherein the memory controller is configured to:
apply a plurality of voltage-regulated bias pulses before applying the current-regulated bias pulse; and
change an amplitude of the voltage-regulated bias pulses while the plurality of voltage-regulated bias pulses is applied.

16. The system of claim 15, wherein the memory device further comprises a plurality of heating elements, each heating element configured to heat a corresponding one of the PCM cells, wherein the heating elements are configured to heat the PCM cells upon application of the voltage-regulated bias pulse or the current-regulated bias pulse.

17. The system of claim 15, wherein the controller is configured to increase the amplitude of the voltage-regulated bias pulses while the plurality of voltage-regulated bias pulses is applied, and wherein the controller is configured to apply the current-regulated bias pulse to the PCM cell in response to the voltage-regulated bias pulse reaching or exceeding a particular value.

* * * * *